United States Patent [19]
Phillips et al.

[11] Patent Number: 5,703,891
[45] Date of Patent: Dec. 30, 1997

[54] PULSE FORMING NETWORK ASSEMBLY

[75] Inventors: Peter E. Phillips, Redondo Beach; Vikram D. Desai, Lake Forest, both of Calif.

[73] Assignee: Hughes Aircraft Company, Los Angeles, Calif.

[21] Appl. No.: 563,502

[22] Filed: Nov. 28, 1995

[51] Int. Cl.$^6$ .................................................. H05B 41/30
[52] U.S. Cl. ........................................ 372/38; 372/25
[58] Field of Search ............................. 372/9, 25, 38

[56] References Cited

U.S. PATENT DOCUMENTS

| | | | |
|---|---|---|---|
| 4,048,597 | 9/1977 | Knight et al. | 334/15 |
| 4,398,129 | 8/1983 | Logan | 372/25 X |
| 4,504,951 | 3/1985 | McMahan et al. | 372/38 |
| 5,255,277 | 10/1993 | Carvalho | 372/38 |
| 5,305,185 | 4/1994 | Samarov et al. | 361/704 |
| 5,315,607 | 5/1994 | Nielsen | 372/38 |

*Primary Examiner*—John D. Lee
*Attorney, Agent, or Firm*—Gordon R. Lindeen, III; Michael W. Sales; Wanda K. Denson-Low

[57] ABSTRACT

A unique pulse forming network assembly designed for use with a laser flashlamp. The inventive assembly includes a planar printed circuit board (14) to which a plurality of electrical energy storage elements (L1, C1) are mounted. The energy storage elements (L1, C1) are mounted on one side of the printed circuit board (14) so that the electrical contacts thereof extend therethrough. The contacts are wave soldered to complete the assembly. In a specific embodiment, the planar mounting of the energy storage elements (L1, C1) is enabled by the substitution of a conventional relay (K1) with a field effect transistor (Q1). The FET selectively connects the energy storage elements (L1, C1) to an output terminal of the network to activate the flashlamp. In a more specific embodiment, at least one of the energy storage elements is a capacitor (C1) which is connected to the housing (16) by a flange (18). The network is assembled by mounting a plurality of electrical components on one side of the printed circuit board (14) so that electrical terminals extend through the board. The terminals are then flow soldered to effect the electrical connection thereof.

4 Claims, 5 Drawing Sheets

PULSE FORMING NETWORK ASSEMBLY

BACKGROUND OF THE INVENTION

1. Field of the Invention

The present invention relates to the design and manufacture of lasers. More specifically, the present invention relates to the design and manufacture of pulse forming networks used to excite lasers.

2. Description of the Related Art

Many lasers are excited by flashlamps. The flashlamps provide optical energy, which, when injected into the laser cavity, stimulate molecules in the medium in the cavity to coherently emit light energy or "lase". Pulse forming networks provide the electrical impulse needed to generate the short burst of high intensity light required to excite the laser. Pulse forming networks generally include an electrical circuit with one or more energy storage elements. The pulse forming network is typically built by hand requiring as many as eighteen (18) process steps. The steps include soldering individual components to stand-off terminals installed on the housing of the pulse forming network. Additional process steps include the sleeving and coating of individual component leads to prevent high voltage arcs. Typically, a main capacitor is bonded in the housing and the leads were sleeved and staked (bonded) to the housing.

Consequently, conventional pulse forming networks assemblies are process intensive to manufacture. The conventional manufacturing process is sufficiently difficult that mistakes are common and require a considerable amount of rework on the production line. In addition, any reworking required is costly and time consuming due to the "layering" of the individual components which quite often required components to be removed to get to the problem component.

Thus, there is a need in the art for a low cost, easy to manufacture pulse forming network and method for manufacturing same.

SUMMARY OF THE INVENTION

The need in the art is addressed by the present invention which provides a unique pulse forming network assembly designed for use with a laser flashlamp. The inventive assembly includes a planar printed circuit board on which a plurality of electrical energy storage elements are mounted. The energy storage elements are mounted on one side of the printed circuit board so that the electrical contacts thereof extend therethrough. The contacts are wave soldered to complete the assembly.

In a specific embodiment, the planar mounting of the energy storage elements is enabled by the substitution of a conventional relay with a field effect transistor (FET). The FET selectively connects the energy storage elements to an output terminal of the network to activate the flashlamp.

In a more specific embodiment, at least one of the energy storage elements is a capacitor. The capacitor is connected to the housing by a flange which is screwed to a casting thereon.

The network is assembled by mounting a plurality of electrical components on one side of a printed circuit board so that electrical terminals therefor extend through the board from a second side thereof. The terminals are then flow soldered to effect the electrical connection thereof.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
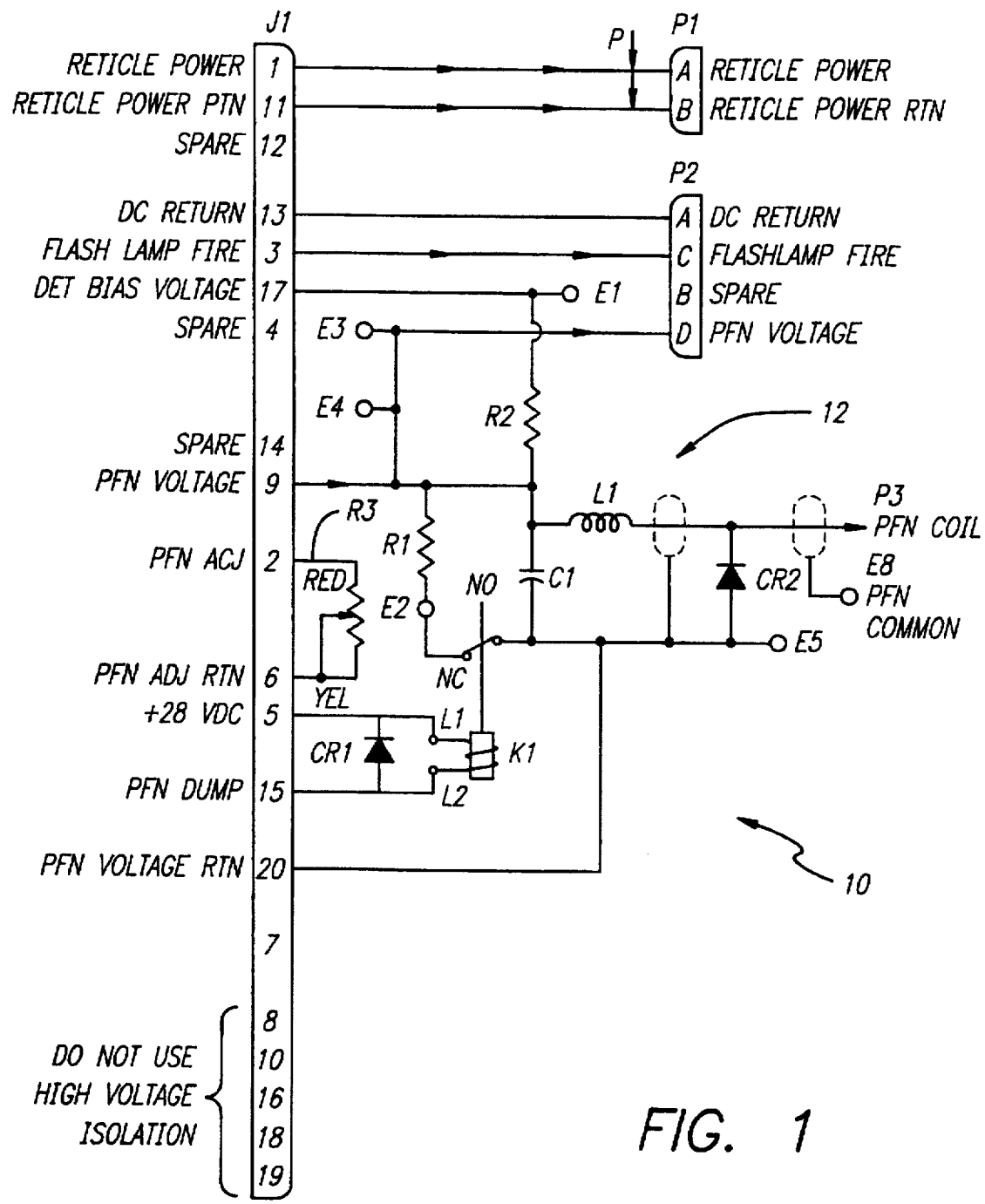
FIG. 1 is a schematic diagram of a conventional pulse forming network.

FIG. 1 is a schematic diagram of a conventional pulse forming network. The circuit 10 includes an RLC tank circuit 12 comprising a parallel combination of a resistor R1, an inductor L1 and a capacitor C1. A first diode is connected across a relay K1. Activation of the relay K1, on receipt of a pulse forming network (PFN) dump signal, connects the resistor R1 across the capacitor C1 and thereby discharges the capacitor C1. Simultaneously, the inductor L1 discharges through a second diode CR2. Hence, on the activation of the relay K1, the tank circuit 12 discharges into a flashlamp (not shown).

Figure 2:
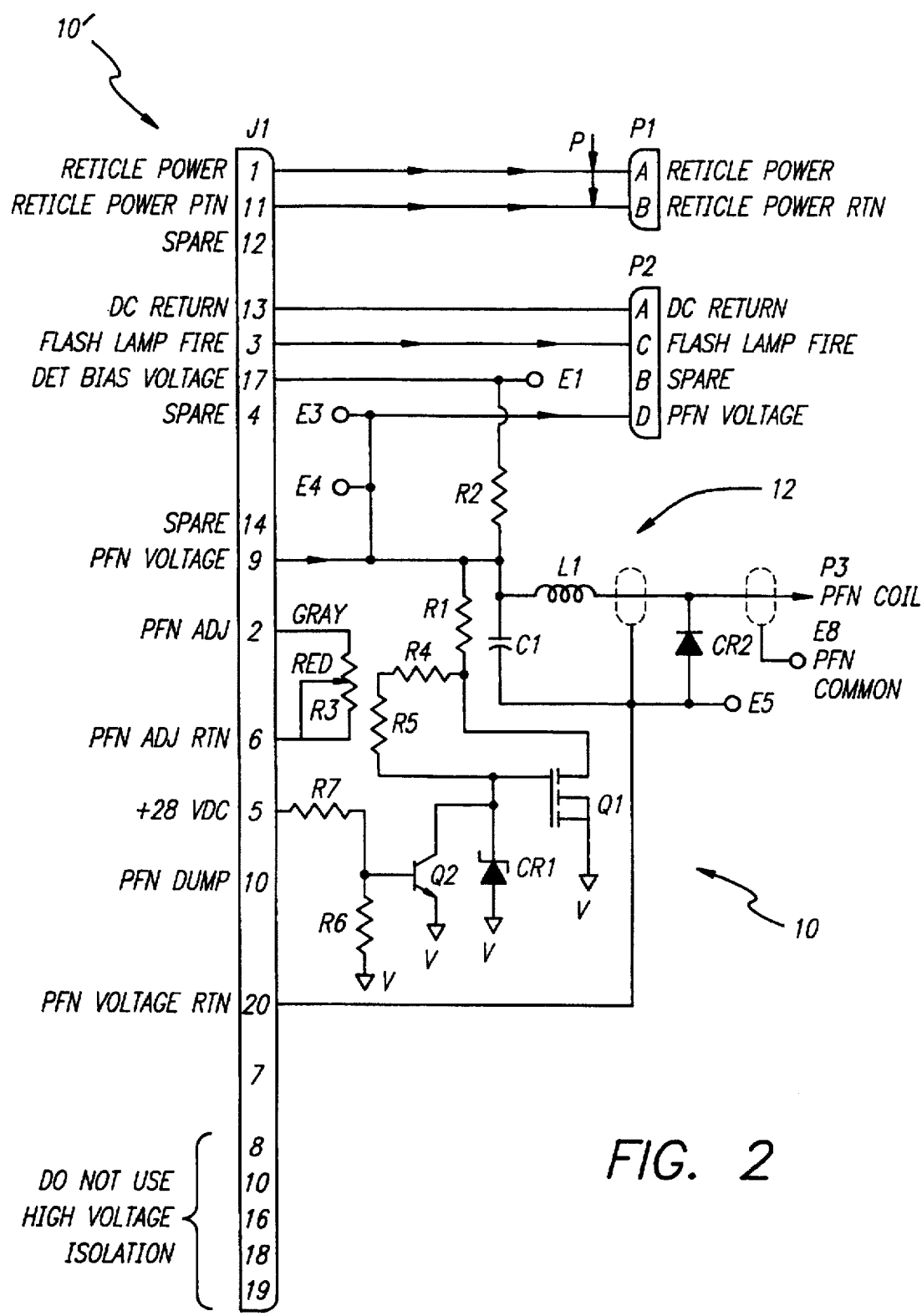
FIG. 2 is a schematic diagram of the pulse forming network 10' of the present invention.

FIG. 2 is a schematic diagram of the pulse forming network 10' of the present invention. The circuit 10' is identical to the circuit 10 of FIG. 1 with the exception that the relay K1 is replaced with a field effect transistor (FET) Q1. The transistor Q1 is biased by resistors R4 and R5. When activated by a bipolar triggering transistor Q2, the transistor Q1 serves to effect a discharge of the tank circuit 12 through the resistor R1. The use of an FET in lieu of a relay K1 allows for a mount on a printed circuit or wiring board in accordance with the present teachings. The electrical circuit 10' is disposed on one side of the printed circuit board with the terminals of each component extending therethrough. The terminal ends and the circuit connections are flow soldered to effect electrical connection therebetween. The result is a faster, easier assembly process and an improved assembly.

Figure 3:
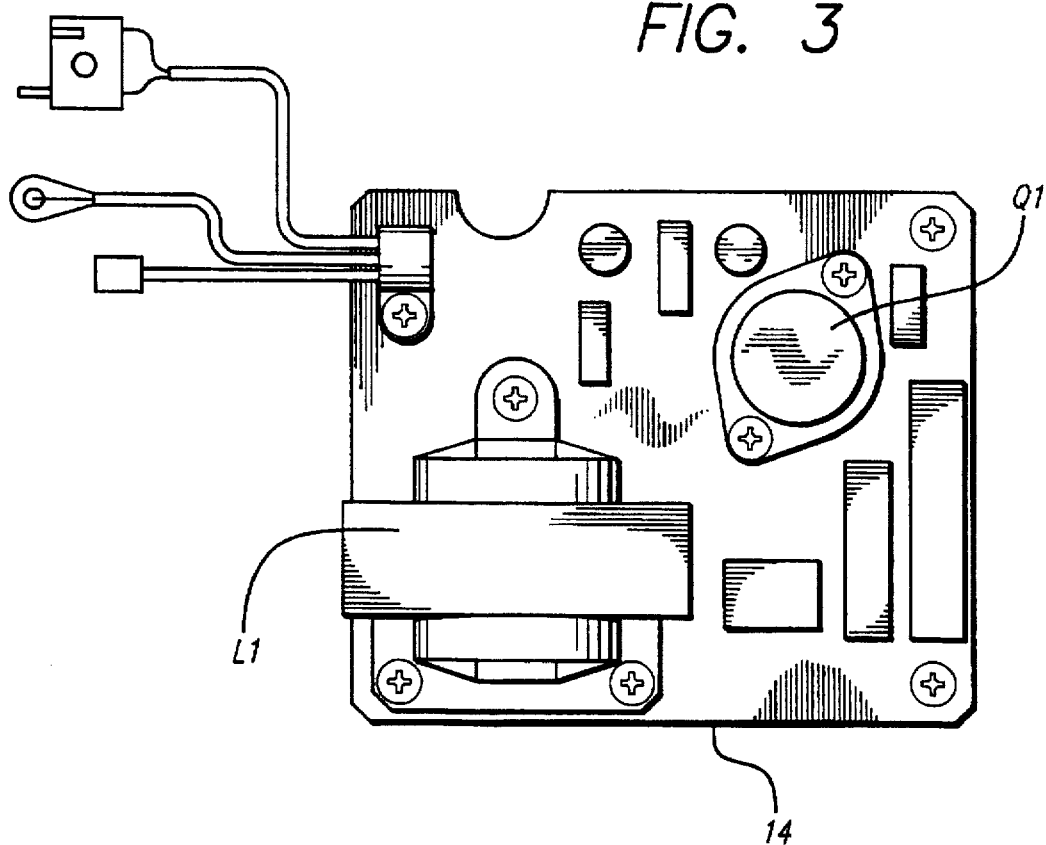
FIG. 3 shows a top view of the pulse forming network of the present invention mounted on a printed circuit board in accordance with the present teachings.

This is best illustrated with respect to FIG. 3 which shows a top view of the pulse forming network of the present invention mounted on a printed circuit board in accordance with the present teachings. With the exception of the capacitor C1, the elements of the circuit 10' are mounted on the printed circuit board 14 including the inductor L1 and the transistor Q1.

Figure 4:
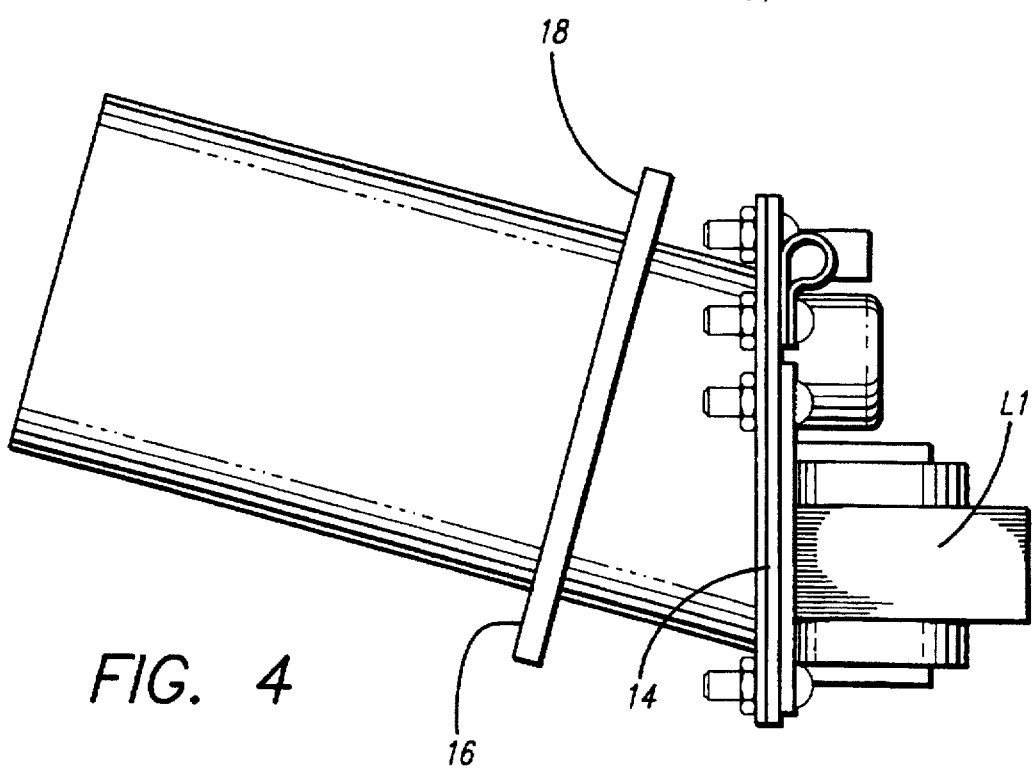
FIG. 4 is a side view of the printed circuit board depicted in FIG. 3.

FIG. 4 is a side view of the printed circuit board depicted in FIG. 3. As shown in FIG. 4, the printed circuit board 14 is screwed onto a pulse forming network mount 16. The mount 16 may be plastic, metal or other suitably rigid material. The capacitor C1 is secured to the mount by a flange 18 which is secured to the housing of the capacitor.

The leads of the capacitor C1 are redesigned from the conventional axial design to one by which both leads extend out of the same side of the capacitor. The leads pass through the mount 16 and connect to the circuit 10' on the printed circuit board 14. The flange 18 allows for an ease of assembly which constitutes an improvement in the prior art. Conventionally, the capacitor C1 is bonded to the network housing and the leads thereof were sleeved and staked (bonded) to the housing. The conventional pulse forming network (PFN) assembly was typically built by hand with 18 process steps. The steps included soldering individual components to standoff terminals installed on the PFN housing. The assembly process also included the sleeving and coating of the individual component leads to prevent high voltage arcing. The assembly was very process intensive and prone to error which caused a considerable amount of reworking. The reworking was expensive and time consuming due to the layering of the individual components which often required the removal of several components to access the problem component. The advantages of the method of assembly afforded by the present invention is set forth with respect to the drawings of FIGS. 5 and 6.

Figure 5:
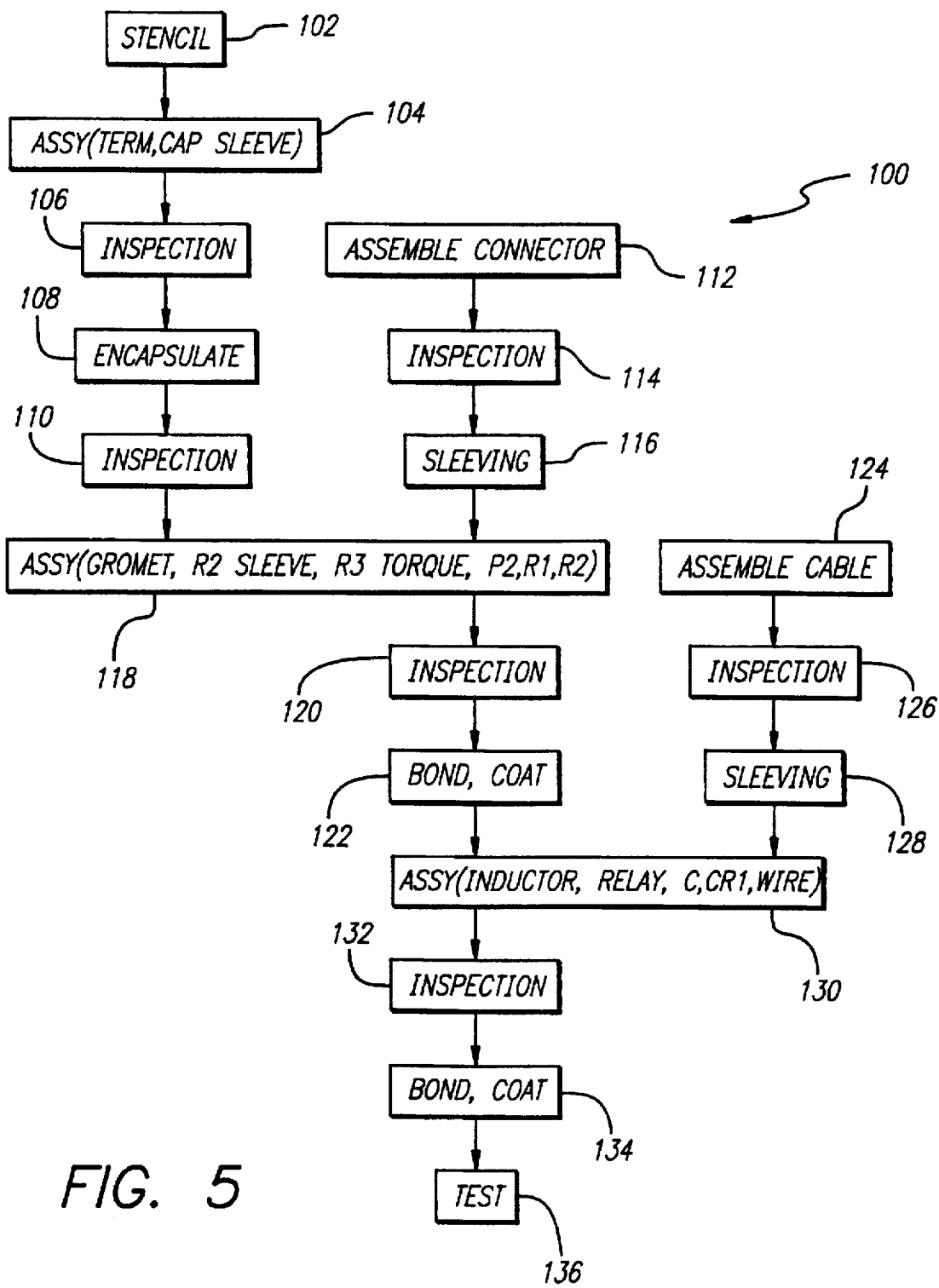
FIG. 5 is a flow diagram which depicts the typical conventional pulse forming network assembly method.

FIG. 5 is a flow diagram which depicts the typical conventional pulse forming network assembly method. The conventional method of assembly includes approximately eighteen (18) manufacturing steps. The inventive method of assembly, on the other hand, can be executed in ten (10) manufacturing steps.

Figure 6:
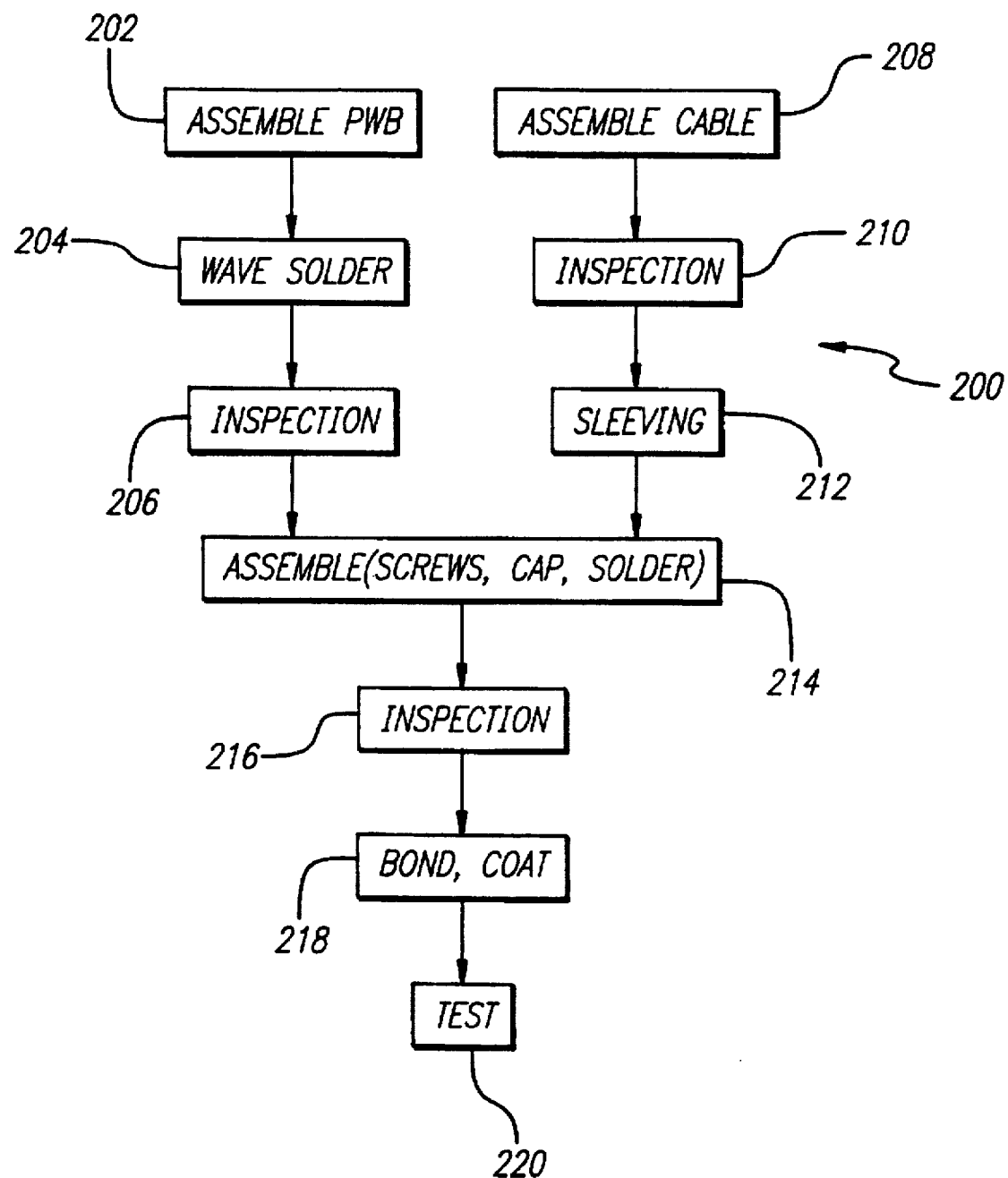
FIG. 6 is a flow diagram of the pulse forming network assembly method of the present invention.

FIG. 6 is a flow diagram of the pulse forming network assembly method of the present invention. The method (200) includes the steps of assembling the printed circuit board 14 (202); wave soldering and inspecting the solder joints (204, 206); assembling the cable (208); inspecting and sleeving the cable (210, 212); completing the assembly of the network (214) and inspecting, bonding and testing the completed unit (216, 218 and 220).

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. A pulse forming network assembly for use with a laser flashlamp comprising:

a planar printed circuit board;

an electrical circuit, including a field effect transistor, mounted on a first side of the printed circuit board and having electrical contacts extending therethrough;

wave solder connected the electrical contacts of the electrical circuit on a second side of the printed circuit board; and an energy storage element mounted on a second side of the printed circuit board, said energy storage element having terminals which are connected to said contacts of said electrical circuit.

2. The invention of claim 1, wherein said energy storage element is a capacitor.

3. The invention of claim 2, wherein said assembly is secured within a housing and said capacitor is secured to said housing by a flange.

4. The invention of claim 2, wherein the capacitor has at least two leads and each of said leads extends from a single side of said capacitor.

* * * * *